(12) United States Patent
Peng et al.

(10) Patent No.: US 11,764,739 B2
(45) Date of Patent: Sep. 19, 2023

(54) RADIO FREQUENCY POWER AMPLIFIER WITH HARMONIC SUPPRESSION

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 435 days.

(21) Appl. No.: 17/134,447

(22) Filed: Dec. 27, 2020

(65) Prior Publication Data

US 2021/0336589 A1 Oct. 28, 2021

Related U.S. Application Data

(63) Continuation of application No. PCT/CN2020/115162, filed on Sep. 14, 2020.

(30) Foreign Application Priority Data

Apr. 23, 2020 (CN) .......................... 202010328483.3

(51) Int. Cl.
*H03F 3/191* (2006.01)
*H03F 1/56* (2006.01)
*H03F 3/24* (2006.01)

(52) U.S. Cl.
CPC ............. *H03F 1/565* (2013.01); *H03F 3/245* (2013.01); *H03F 2200/387* (2013.01); *H03F 2200/451* (2013.01)

(58) Field of Classification Search
CPC .................................. H03F 3/191; H03F 3/187
USPC .......................................... 330/302, 307, 305
See application file for complete search history.

(56) References Cited

U.S. PATENT DOCUMENTS

| 8,122,393 | B2 * | 2/2012 | Goren ................. H01L 23/5225 |
| | | | 716/139 |
| 9,130,511 | B2 * | 9/2015 | Ma .......................... H03F 3/245 |
| 11,552,597 | B2 * | 1/2023 | Wilson ..................... H01L 23/66 |
| 2021/0384866 | A1 * | 12/2021 | Wilson .................. H03F 1/3241 |

* cited by examiner

*Primary Examiner* — Henry Choe
(74) *Attorney, Agent, or Firm* — SYNCODA LLC; Feng Ma (57) ABSTRACT

In a radio frequency power amplifier with harmonic suppression, one end of an input matching circuit is connected with a radio frequency input end; and another end is connected with a base of a power amplification transistor having a collector connected with a power supply voltage through a first matching branch, and an emitter connected with a first connection point on a package substrate. The collector of the power amplification transistor is connected with a radio frequency output end through a second matching branch that is connected with the package substrate. A harmonic control circuit has a first end connected with the collector of the power amplification transistor, and a second end connected with a second connection point on the package substrate.

20 Claims, 3 Drawing Sheets

RADIO FREQUENCY POWER AMPLIFIER WITH HARMONIC SUPPRESSION

CROSS-REFERENCE TO RELATED APPLICATIONS

This application is a continuation of International Application No. PCT/CN2020/115162 filed on Sep. 14, 2020, which claims priority to Chinese Patent Application No. 202010328483.3 filed on Apr. 23, 2020. The disclosures of these applications are hereby incorporated by reference in their entirety.

BACKGROUND

In a mobile communication system, the efficiency and linear power of a front-end radio frequency power amplifier play a very important role in the energy consumption and communication quality of a mobile terminal. A radio frequency power amplifier typically includes a power amplification transistor, a harmonic control circuit, and a package substrate.

SUMMARY

The present disclosure relates generally to the field of electronic circuitry, and more specifically a radio frequency power amplifier with harmonic suppression.

Various embodiments of the disclosure provide a radio frequency power amplifier with harmonic suppression, which includes a power amplification transistor, a harmonic control circuit, an input matching circuit, an output matching circuit and a package substrate, herein the output matching circuit includes a first matching branch and a second matching branch;

One end of the input matching circuit is connected with a radio frequency input end; and the other end of the input matching circuit is connected with a base of the power amplification transistor;

A collector of the power amplification transistor is connected with a power supply voltage through the first matching branch, and an emitter of the power amplification transistor is connected with a first connection point on the package substrate;

The collector of the power amplification transistor is connected with a radio frequency output end through the second matching branch; and the second matching branch is connected with the package substrate;

A first end of the harmonic control circuit is connected with the collector of the power amplification transistor, and a second end of the harmonic control circuit is connected with a second connection point on the package substrate; and The package substrate includes multiple metal layers arranged in parallel, the metal layer, farthest from the power amplification transistor, of the multiple metal layers arranged in parallel is a first metal layer which is grounded, and a dielectric layer is arranged between adjacent two of the metal layers, and the first connection point is connected with the first metal layer, the first connection point and the second connection point are located on a second metal layer of the multiple metal layers, and the first connection point is connected with the second connection point, and the second metal layer is the metal layer, closest to the power amplification transistor, of the multiple metal layers; and the distance between the first connection point and the second connection point is less than a target distance.

In an embodiment, the harmonic control circuit includes a first branch, and the first branch includes a first capacitor and a first inductor; herein the first capacitor and the first inductor are connected in series.

In an embodiment, the harmonic control circuit further includes at least a second branch, and the second branch includes a second capacitor and a second inductor; herein the second capacitor and the second inductor are connected in series, and each of the second branches is connected in parallel with the first branch.

In an embodiment, the first capacitor is a variable capacitor.

In an embodiment, one end of the second matching branch is connected with the collector of the power amplification transistor, and the other end of the second matching branch is connected with a third connection point on the first metal layer; and the output matching circuit is configured to provide load impedance for the power amplification transistor.

In an embodiment, the first matching branch includes an inductor, and the first matching branch is configured to supply power to the power amplification transistor.

In an embodiment, the second matching branch includes a third inductor and a third capacitor, and one end of the third inductor is connected with the collector of the power amplification transistor, the other end of the third inductor is connected with one end of the third capacitor, and the other end of the third capacitor is connected with the third connection point.

In an embodiment, the output matching circuit further includes a third matching branch, and the third matching branch includes a fourth inductor and a fourth capacitor, and one end of the fourth inductor is connected between the third inductor and the third capacitor, the other end of the fourth inductor is connected with one end of the fourth capacitor, and the other end of the fourth capacitor is connected with a fourth connection point on the first metal layer.

In an embodiment, the input matching circuit is arranged between the base of the power amplification transistor and the radio frequency input end, and the input matching circuit is configured to match the impedance between components.

Various embodiments provided by the disclosure can have one or more of the following advantages.

A radio frequency power amplifier with harmonic suppression provided by the embodiments of the disclosure includes a power amplifier, a harmonic control circuit, an input matching circuit, an output matching circuit and a package substrate, herein the output matching circuit includes a first matching branch and a second matching branch; one end of the input matching circuit is connected with a radio frequency input end; and the other end of the input matching circuit is connected with a base of the power amplification transistor; a collector of the power amplification transistor is connected with a power supply voltage through the first matching branch, and an emitter of the power amplification transistor is connected with a first connection point on the package substrate; and the collector of the power amplification transistor is connected with a radio frequency output end through the second matching branch; and the second matching branch is connected with the package substrate; a first end of the harmonic control circuit is connected with the collector of the power amplification transistor, and a second end of the harmonic control circuit is connected with a second connection point on the package substrate; and the package substrate includes multiple metal layers arranged in parallel, the metal layer, farthest from the power amplification transistor, of the multiple metal layers arranged in parallel is a first metal layer which is grounded, and a dielectric layer is arranged between adjacent two of the metal layers, and the first connection point is connected with the first metal layer, the first connection point and the second connection point are located on a second metal layer of the multiple metal layers, and the first connection point is connected with the second connection point, and the second metal layer is the metal layer, closest to the power amplification transistor, of the multiple metal layers; and the distance between the first connection point and the second connection point is less than a target distance. In this way, the wiring between both the power amplification transistor and the harmonic control circuit and the package substrate is flexibly set without introducing additional components, which reduces the backflow area of harmonic current, eliminates the parasitic influence of the grounding inductor of the package substrate, improves the efficiency and linearity of the radio frequency power amplifier, and reduces the electromagnetic radiation of the radio frequency power amplifier.

In the harmonic current loop generated by the power amplification transistor, the harmonic current flows back to the power amplification transistor through the low-resistance path composed of the capacitor and inductor of the harmonic control circuit and then through the emitter of the power amplification transistor; in this way, without using the grounding inductor of the package substrate, it solves the problem that the secondary voltage component on the grounding inductor is superimposed on the output voltage and improves the efficiency of the power amplifier.

The harmonic short-circuit circuit composed of the capacitor and inductor of the harmonic control circuit does not need to connect to the equivalent grounding inductor of the package substrate; so that the equivalent inductor obtained after the inductor of the resonant control circuit and the equivalent grounding inductor of the package substrate are connected in series is equal to the inductor of the resonant control circuit, so as to ensure that the quality factor of the equivalent inductor after being connected in series is equal to that of the inductor of the resonant control circuit, and the equivalent impedance of the harmonic short-circuit resistance is reduced, the degree of harmonic suppression is better, and the harmonic power output by the output end becomes smaller, thus meeting the requirements of harmonic index of the communication protocol for the radio frequency power amplifier.

DETAILED DESCRIPTION

In order to make those skilled in the art understand the solutions of the disclosure better, the technical solutions of the embodiments of the disclosure will be described clearly and completely below with reference to the drawings of the embodiments of the disclosure, and apparently, the described embodiments are only a part of the embodiments of the disclosure, not all of them.

The power amplification transistor and the harmonic control circuit are typically grounded through the via of the underlying substrate of the package substrate, respectively, and the harmonic voltage generated by harmonic current flowing through the via of the substrate is superimposed on the output voltage, which may result in the deviation of the waveform of the output voltage from that of the ideal power amplifier. To output the same power, it may be needed to increase the operating current, so that the effect of improving the efficiency of the amplifier weakens. Moreover, the degree of harmonic suppression in the harmonic control circuit is poor, which results in the harmonic power output by the radio frequency output end becoming larger, which does not meet the requirements of harmonic index of the communication protocol for the power amplifier; and under the same current, the loop area of harmonic current is large, and electromagnetic radiation is easy to be generated, which results in the problem of risk of the Electro Magnetic Compatibility (EMC) of the radio frequency power amplifier.

At present, in a mobile communication system, the efficiency and linear power of a front-end radio frequency power amplifier directly affect the energy consumption and communication quality of a mobile terminal, and the Adjacent Channel Leakage Ratio (ACLR) index obtained after the uplink modulation signal of the terminal device is amplified by the front-end power amplifier shall meet the requirements of various mobile communication protocols. According to DC bias point and controlling of output waveform, the radio frequency power amplifier may be classified into type A, type AB, type B and type C, besides type D, type E, type F and inverse type F, etc.

In order to balance the efficiency, linearity and engineering implementation of the power amplifier, most of the terminal devices in related art use the radio frequency power amplifier of type F. The DC bias point of the last-stage power amplification transistor of the ideal radio frequency power amplifier of type F is generally in that of type AB or type B, and the output node of the power amplification transistor has a harmonic control circuit to realize the output of short-circuit of the even harmonic voltage (2f0, 4f0, . . . , nf0, n is even, f0 is the fundamental frequency, i.e., the operating frequency) and the high resistance or open circuit of the odd harmonic voltage (3f0, 5f0, . . . , mf0, m is odd), and the amplitude of the even harmonic voltage is zero, the amplitude of the odd harmonic voltage is appropriate, the waveform of voltage Vout of the output node is a square wave. According to the Fourier expansion of the square wave, the ratio of the fundamental frequency voltage Vf0 of the power amplifier of type F with the DC voltage Vdc is $4/\pi$, while Vf0/Vdc of the power amplifier of type AB without harmonic control is 1, therefore, under the same output power, the load impedance of the power amplifier of type F may be selected to be higher than that of the traditional power amplifier of type AB, with smaller operating current and better efficiency. Considering the chip area occupied by the harmonic control circuit and the engineering implementation, in fact, the output node of the radio frequency power amplifier of type F usually has only a harmonic control circuit of 2f0.

However, the radio frequency power amplifier in the related art includes a power amplification transistor, a harmonic control circuit and a package substrate, herein the power amplification transistor and the harmonic control circuit are grounded through the via of the underlying substrate of the package substrate, respectively, and the harmonic voltage generated by harmonic current flowing through the via of the substrate is superimposed on the output voltage, which results in the deviation of the waveform of the output voltage from that of the ideal power amplifier, and in order to output the same power, it is necessary to increase the operating current, so that the effect of improving the efficiency of the amplifier weakens; moreover, the degree of harmonic suppression in the harmonic control circuit is poor, which results in the harmonic power output by the radio frequency output end becoming larger, which does not meet the requirements of harmonic index of the communication protocol for the power amplifier; and under the same current, the loop area of harmonic current is large, and electromagnetic radiation is easy to be generated, which results in the problem of risk of the EMC of the radio frequency power amplifier.

Figure 1:
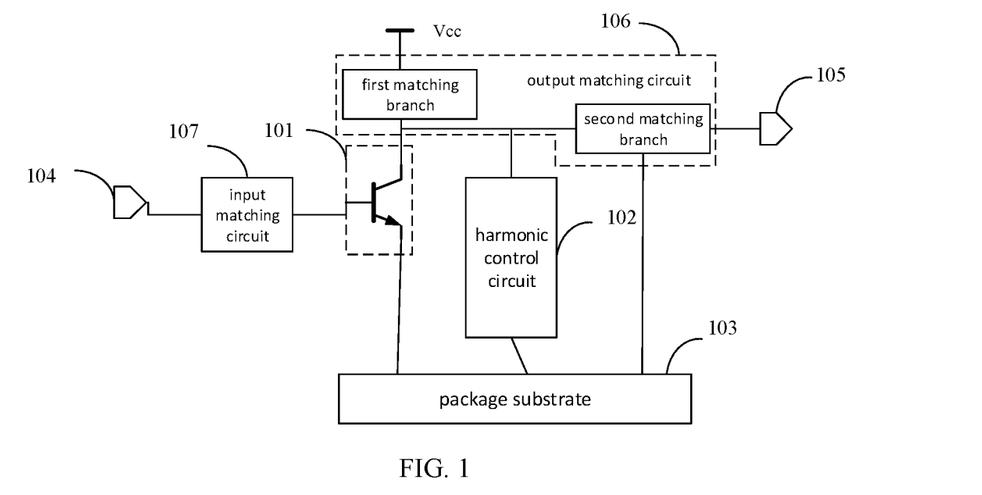
FIG. 1 is a diagram of a circuit of a radio frequency power amplifier with harmonic suppression according to some embodiments of the disclosure.

As illustrated in FIG. 1, an alternative circuit of a radio frequency power amplifier with harmonic suppression is provided by an embodiment of the disclosure, and the radio frequency power amplifier includes a power amplification transistor 101, a harmonic control circuit 102, an input matching circuit 107, an output matching circuit 106 and a package substrate 103, herein the output matching circuit 106 includes a first matching branch and a second matching branch; and the output matching circuit 106 is configured to provide load impedance for the power amplification transistor 101;

One end of the input matching circuit 107 is connected with a radio frequency input end 104; and the other end of the input matching circuit 107 is connected with a base of the power amplification transistor 101.

A collector of the power amplification transistor 101 is connected with the power supply voltage Vcc through the first matching branch, and an emitter of the power amplification transistor 101 is connected with a first connection point on the package substrate 103; and the first connection point may also be referred to as the first via.

The collector of the power amplification transistor 101 is connected with a radio frequency output end 105 through the second matching branch; and the second matching branch is connected with the package substrate 103.

A first end of the harmonic control circuit 102 is connected with the collector of the power amplification transistor 101, and a second end of the harmonic control circuit 102 is connected with a second connection point on the package substrate 103.

The package substrate 103 includes multiple metal layers arranged in parallel, the metal layer, farthest from the power amplification transistor 101, of the multiple metal layers arranged in parallel is a first metal layer which is grounded, and a dielectric layer is arranged between adjacent two of the metal layers, and the first connection point is connected with the first metal layer, the first connection point and the second connection point are located on a second metal layer of the multiple metal layers, and the first connection point is connected with the second connection point, and the second metal layer is the metal layer, closest to the power amplification transistor, of the multiple metal layers, which is also referred to as a top metal layer of the package substrate. In this way, the emitter of the power amplification transistor is connected with the first connection point on the package substrate, and the emitter of the power amplification transistor is connected with the first metal layer through the package substrate, and the second end of the harmonic control circuit is connected with the second connection point on the package substrate, and the first connection point is connected with the second connection point, and the first and second connection points are located on the second metal layer of the package substrate, ensuring that the current backflow path of the harmonic current does not need the backflow path in which the backflow passes through the first metal layer on the package substrate.

It should be noted that the distance between the first connection point and the second connection point is less than a target distance. In an ideal state, the first connection point and the second connection point are the same point on the top metal layer of the package substrate, so that the grounding hole of the power amplification transistor 101 is shared with the grounding hole of the second-order harmonic short-circuit, and the two holes are connected through the top metal layer of the package substrate 103, and the current backflow path of the second-order harmonic turns to be wiring through the harmonic control circuit to the top metal layer, then flows back to the power amplification transistor 101, and the loop path of the second-order harmonic circuit avoids the influence of the grounding inductor, which greatly improves the electromagnetic compatibility performance of the radio frequency power amplifier.

In some cases, some other electronic components may be arranged on the top metal layer of the package substrate, so that a certain distance is formed between the first connection point and the second connection point, and in the embodiment of the disclosure, it is ensured that the distance between the first connection point and the second connection point is less than the target distance, and the target distance is a sufficiently small distance.

For a radio frequency power amplifier with harmonic suppression provided by other embodiments of the disclosure, the first connection point and the second connection point are two connection points with a relatively close distance on the second metal layer, and the first connection point and the second connection point are connected through the second metal layer. In this way, a short metal wiring is skillfully utilized to connect the first connection point with the second connection point, so that the connection between the first connection point and the second connection point is a short-circuit connection.

The embodiments of the disclosure provide a radio frequency power amplifier with harmonic suppression, which includes a power amplification transistor, a harmonic control circuit and a package substrate, herein, an input matching circuit includes a first matching branch and a second matching branch; one end of the input matching circuit is connected with a radio frequency input end; and the other end of the input matching circuit is connected with a base of the power amplification transistor; a collector of the power amplification transistor is connected with a power supply voltage through the first matching branch, and an emitter of the power amplification transistor is connected with a first connection point on the package substrate; and the collector of the power amplification transistor is connected with a radio frequency output end through the second matching branch; and the second matching branch is connected with the package substrate; a first end of the harmonic control circuit is connected with the collector of the power amplification transistor, and a second end of the harmonic control circuit is connected with a second connection point on the package substrate; the package substrate includes multiple metal layers arranged in parallel, the metal layer, farthest from the power amplification transistor, of the multiple metal layers arranged in parallel is a first metal layer which is grounded, and a dielectric layer is arranged between adjacent two of the metal layers, and the first connection point is connected with the first metal layer, the first connection point and the second connection point are located on a second metal layer of the multiple metal layers, and the first connection point is connected with the second connection point, and the second metal layer is the metal layer, closest to the power amplification transistor, of the multiple metal layers; and the distance between the first connection point and the second connection point is less than a target distance; In this way, firstly, the wiring between both the power amplification transistor and the harmonic control circuit and the package substrate is flexibly set without introducing additional components, which reduces the backflow area of harmonic current, eliminates the parasitic influence of the grounding inductor of the package substrate, improves the efficiency and linearity of the radio frequency power amplifier, and reduces the electromagnetic radiation of the radio frequency power amplifier. Secondly, for the harmonic current generated by the power amplification transistor, the harmonic current flows back to the power amplification transistor through the low-resistance path composed of the capacitor and inductor of the harmonic control circuit and then through the emitter of the power amplification transistor; in this way, without using the grounding inductor of the package substrate, it solves the problem that the secondary voltage component on the grounding inductor is superimposed on the output voltage and improves the output efficiency of the power amplifier. Finally, the harmonic short-circuit circuit composed of the capacitor and inductor of the harmonic control circuit does not need to connect to the equivalent grounding inductor of the package substrate; so that the equivalent inductor obtained after the inductor of the resonant control circuit and the equivalent grounding inductor of the package substrate are connected in series is equal to the inductor of the resonant control circuit, so as to ensure that the quality factor of the equivalent inductor after being connected in series is equal to that of the inductor of the resonant control-circuit, and the equivalent impedance of the harmonic short-circuit resistance is reduced, the degree of harmonic suppression is better, and the harmonic power output by the output end becomes smaller, thus meeting the requirements of harmonic index of the communication protocol for the radio frequency power amplifier.

Figure 2:
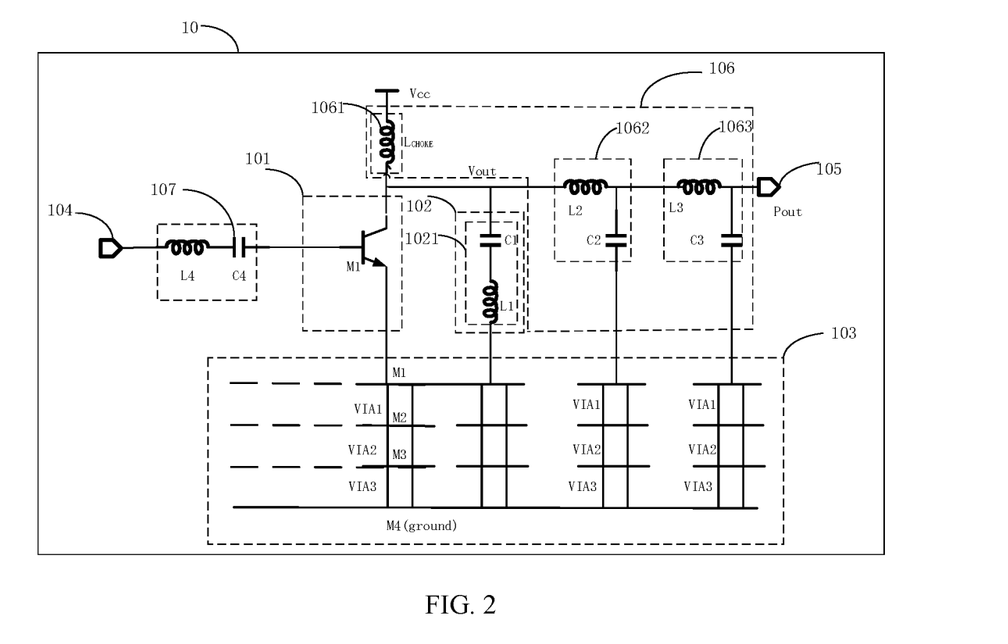
FIG. 2 is a diagram of another circuit of a radio frequency power amplifier with harmonic suppression according to some embodiments of the disclosure.

As illustrated in FIG. 2, another circuit of a radio frequency power amplifier with harmonic suppression is provided by an embodiment of the disclosure, and the radio frequency power amplifier 10 includes a power amplification transistor 101, a harmonic control circuit 102, a package substrate 103, an output matching circuit 106 and an input matching circuit 107.

The harmonic control circuit 102 includes a first branch 1021, and the first branch 1021 includes a first capacitor C1 and a first inductor L1; herein, the first capacitor C1 and the first inductor L1 are connected in series.

The output matching circuit 106 includes a first matching branch 1061 and a second matching branch 1062; herein, one end of the first matching branch 1061 is connected with the power supply voltage Vcc, and the other end of the first matching branch 1061 is connected with the collector of the power amplification transistor 101; and one end of the second matching branch 1062 is connected with the collector of the power amplification transistor 101, and the other end of the second matching branch 1062 is connected with a third connection point on the first metal layer; and the output matching circuit 106 is configured to provide load impedance for the power amplification transistor; and the third connection point may also be referred to as the third via.

Herein, the first matching branch 1061 includes an inductor $L_{CHOKE}$, and the first matching branch 1061 is configured to supply power to the power amplification transistor 101.

The second matching branch 1062 includes a third inductor L2 and a third capacitor C2, and one end of the third inductor L2 is connected with the collector of the power amplification transistor, and the other end of the third inductor L2 is connected with one end of the third capacitor C2, and the other end of the third capacitor C2 is connected with the third connection point.

Herein, the output matching circuit 106 further includes a third matching branch 1063, and the third matching branch 1063 includes a fourth inductor L3 and a fourth capacitor C3, and one end of the fourth inductor L3 is connected between the third inductor L2 and the third capacitor C2, and the other end of the fourth inductor L3 is connected with one end of the fourth capacitor C3, and the other end of the fourth capacitor C3 is connected with a fourth connection point on the first metal layer; and the fourth connection point may also be referred to as the fourth via.

Herein, the input matching circuit 107 is arranged between the base of the power amplification transistor 101 and the radio frequency input end 104, and the input matching circuit 107 is configured to match the impedance between components.

The input matching circuit 107 includes a fifth inductor L4 and a fifth capacitor C4, and one end of the fifth inductor L4 is connected with the radio frequency input end 104, and the other end of the fifth inductor L4 is connected with one end of the fifth capacitor C4, and the other end of the fifth capacitor C4 is connected with the base of the power amplification transistor 101, herein the fifth capacitor C4 is a DC isolating capacitor, and in an output current of a certain device, there are both AC current and DC current therein, when only the AC current needs to input to the next-stage device, then a DC isolating capacitor is simply connected between the two circuits, so that the AC current will reach the next-stage device through the capacitor, while the DC current will remain in the previous stage device. Herein, the input matching circuit is configured to match the impedance between components, so as to avoid the loss of power in the transmission of radio frequency signal.

Figure 3:
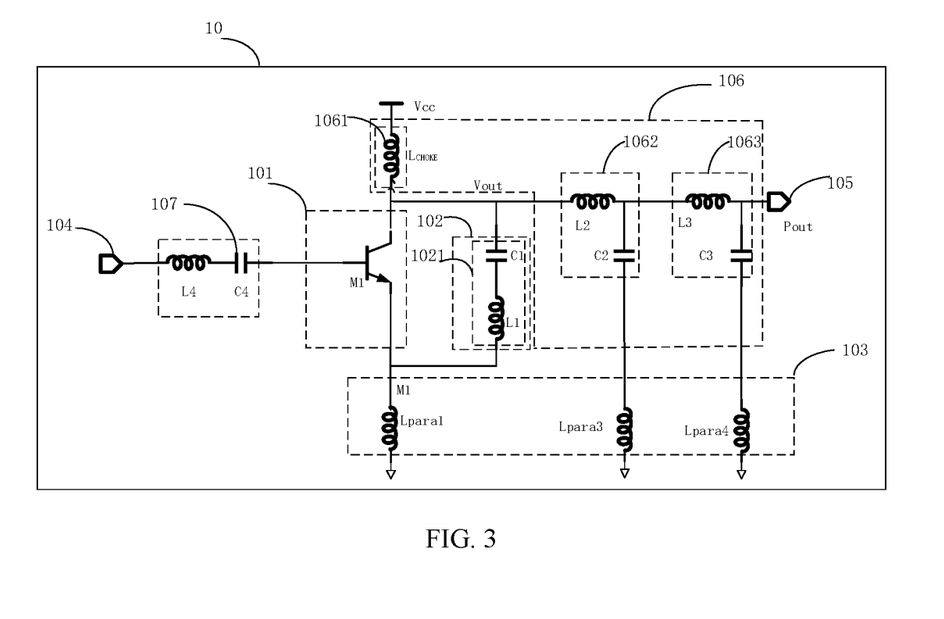
FIG. 3 is a diagram of yet another circuit of a radio frequency power amplifier with harmonic suppression according to some embodiments of the disclosure.

Herein, for the package substrate, in practical applications, the number of metal layers of the package substrate is greater than or equal to 2, and every adjacent two of the metal layers are separated by a dielectric, and the dielectric between every adjacent two of the metal layers may be the same or different; and the material of the dielectric may be a common flame-resistant material such as FR4 or an epoxy plate material such as FR5, which is not specifically limited in the disclosure. In addition, since there is a certain thickness between the metal plates, the metal layer, closest to the power amplifier, i.e., the second metal layer, of the package substrate passes through the via to the first metal layer of the package substrate, and the via will generate impedance, which may be understood as equivalent inductor, as illustrated in FIG. 3.

Figure 4:
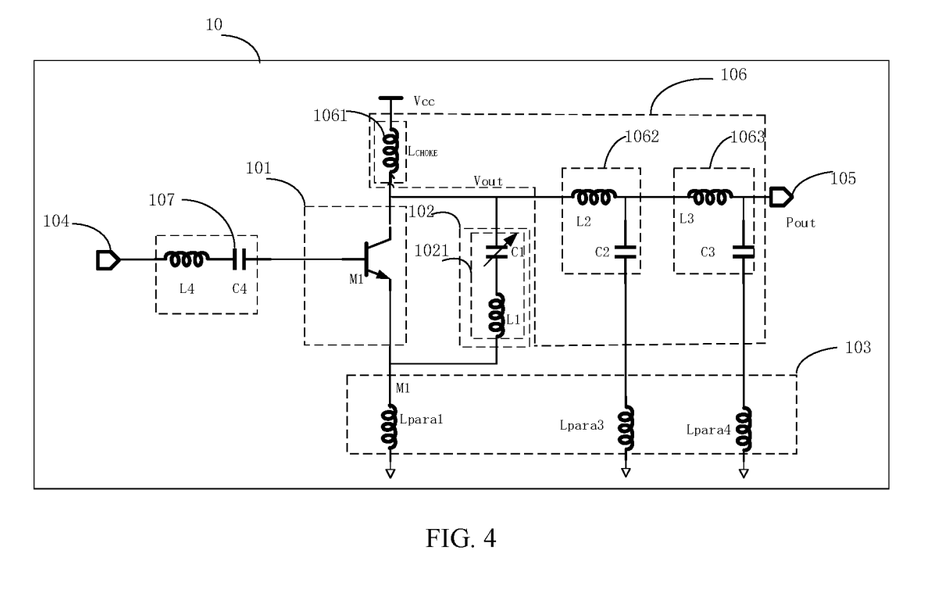
FIG. 4 is a diagram of another circuit of a radio frequency power amplifier with harmonic suppression provided by some embodiments of the disclosure.

Based on the above embodiments, another circuit of a radio frequency power amplifier with harmonic suppression is provided by an embodiment of the disclosure, as illustrated in FIG. 4, and the first capacitor C1 of the first branch 1021 of the harmonic control circuit 102 is a variable capacitor.

Figure 5:
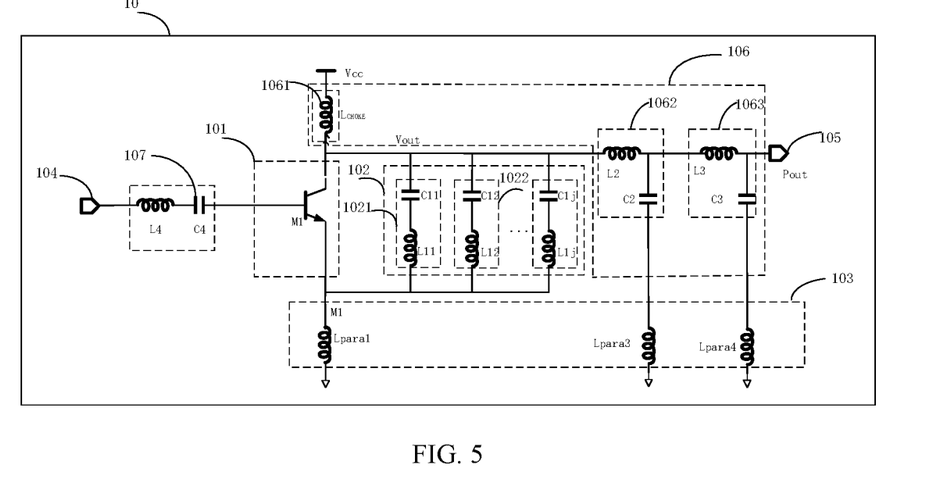
FIG. 5 is a diagram of yet another circuit of a radio frequency power amplifier with harmonic suppression provided by some embodiments of the disclosure.

A diagram of an alternative circuit of a radio frequency power amplifier with harmonic suppression is provided by an embodiment of the disclosure, as illustrated in FIG. 5, and the harmonic control circuit 102 further includes at least one second branch 1022, and the second branch 1022 includes a second capacitor C12 and a second inductor L12; herein, the second capacitor C12 and the second inductor L12 are connected in series, and each of the second branches 1022 is connected in parallel with the first branch 1021.

In practical applications, there is a first branch and at least a second branch in the harmonic control circuit, which enables the harmonic control circuit to resonate at different resonance points, that is, to resonate at different operating frequencies; exemplarily, when the operating frequency of resonance of the first branch is 2f0, the resonance control circuit may also resonate at the third-order operating frequency, that is, at the 3f0 operating frequency, and the resonance control circuit may also resonate at the k-order operating frequency, that is, at a frequency of K times of f0, herein K>3 and K is an integer.

Based on the above embodiments, the radio frequency power amplifier with harmonic suppression provided by the embodiments of the disclosure will be further explained:

As illustrated in FIG. 2, the radio frequency power amplifier includes a power amplification transistor M1, an output matching circuit, a second-order harmonic control circuit and a package substrate.

Herein, the power amplification transistor M1 is the key component for implementing power amplification, and is powered by a power supply Vcc through an inductor $L_{CHOKE}$, and the power amplification transistor M1 is generally integrated on a chip (die), and the power amplification transistor M1 may be an FET transistor, an HBT transistor, or a BJT transistor, and the disclosure does not limit the power amplification transistor M1.

Herein, the output matching circuit includes inductors L2, L3, $L_{CHOKE}$ and capacitors C2, C3, which provides a suitable load impedance for the power amplification transistor M1.

Herein, the harmonic control circuit includes a capacitor C1 and an inductor L1, and for the resonant frequency at the second-order harmonic, its resonant equivalent resistor is Rres, and the harmonic control circuit is equivalent to an inductor Lequ1 at the third-order harmonic frequency, and the third-order impedance is matched to high resistance to provide the desired harmonic impedance for the power amplification transistor M1 to operate in type F. According to circuit knowledge, the higher the value of equivalent quality factor Q of at least one of the capacitor C1 or inductor L1, the smaller the short-circuit resistance to achieve the second-order harmonic, and the more the voltage amplitude of the second-order harmonic closing to zero, the more the output voltage Vout closing to the ideal square wave, and the more apparent the improvement in the efficiency of the power amplifier. The capacitor C1 is usually the capacitor on the die, and its value of Q is usually above 100, and the inductor L1 is usually realized with wide M1 wiring or multiple bonded alloy wires, and its value of Q is usually designed around 40~50. In addition, usually, the value of the capacitor C1 is larger and the value of the inductor L1 is smaller, which makes the second-order harmonic wave exhibit enough low resistance in a certain frequency range, so that the power amplifier has better efficiency performance in a certain operating frequency band, for example, for the power amplifier operating at a frequency band of 1700 M~2700 M, the value of the capacitor C1 takes 4~5 pF, and the value of the inductor L1 takes 0.3~0.5 nH; capacitors C1, C2, C3 may use Surface Mounted Devices (SMD) devices, or may be implemented by capacitors on the die; and inductors L1, $L_{choke}$, L2, L3 may be a substrate winding wires, and may also be bonded alloy wires, or SMD devices.

Herein, the number of metal layers of the circuit substrate of the package substrate may be any number of layers greater than or equal to 2, here, by combining with what illustrated in FIGS. 2-5, and taking the package substrate with four layers of metal as an example, the schematic diagram of packaging the substrate in the radio frequency power amplifier is given in the embodiments of the disclosure; and layers M1, M2, M3 and M4 are layers of metal wiring (M1 layer of metal wiring is equivalent to the second metal layer and M4 layer of metal wiring is equivalent to the first metal layer), and every adjacent two of the layers are separated by dielectric 1, dielectric 2 and dielectric 3 respectively, and the materials of the dielectric 1, dielectric 2 and dielectric 3 may be the same or different, which is not specifically limited in the disclosure; and the material of the dielectric may be a common FR4 or other dielectric materials. Via1 is a via from the metal layer M1 to the metal layer M2, and Via2 is a via from the metal layer M2 to the metal layer M3, and Via3 is a via from the metal layer M3 to the metal layer M4, which realizes the electrical connection between the chip (die), SMD device and substrate wiring; and the height from M1 to M4 is the thickness of the substrate, and the thickness is usually about 220 um, and the equivalent inductors of each of the vias from the first layer to the fourth layer are Lpara1, Lpara3 and Lpara4, respectively and the inductance thereof is usually 0.8~0.1 nH, and the value of Q is about 30.

Herein, the harmonic control circuit is connected with the second connection point of the M1 layer of metal wiring, i.e., the top metal layer of the package substrate, through the vias of the substrate. The emitter of the power amplification transistor is further connected with the first connection point of the M1 layer of metal wiring, and the first connection point is further connected with the M4 layer of metal wiring. In the output matching circuit, the capacitor C2 is connected to the M4 layer of metal wiring through the third connection point and the capacitor C3 is connected to the M4 layer of metal wiring through the fourth connection point.

Various embodiments of the disclosure can have one or more of the following advantages.

A radio frequency power amplifier with harmonic suppression is provided by the disclosure, for the second-order harmonic current generated by the power amplification transistor M1, the second-order harmonic current passes through the low-resistance path composed of the capacitor C1 and inductor L1, and then flows back to the power amplification transistor M1 from the emitter of the power amplification transistor M1; in this way, without using the grounding inductor Lpara1 of the package substrate, it solves the problem that the secondary voltage component on the grounding inductor Lpara1 is superimposed on the output voltage Vout, and improves the efficiency of the power amplifier.

The harmonic short-circuit circuit, composed of the capacitor C1 and inductor L1, of the harmonic control circuit does not need to connect to the equivalent grounding inductor Lpara2 (not illustrated in the figures) of the package substrate; in this way, so that the equivalent inductor Lequ2 obtained after the inductor L1 of the resonant control circuit and the equivalent grounding inductor Lpara2 of the package substrate are connected in series is equal to the inductor L1 of the resonant control circuit, that is, Lequ2=L1, so as to ensure that the quality factor Q of the equivalent inductor Lequ2 after being connected in series is equal to the quality factor Q of the inductor of the resonant control circuit, and the equivalent Rres of second-order harmonic short-circuit resistance is reduced, the degree of second-order harmonic suppression is better, and the second-order harmonic power output by the output end becomes smaller, thus meeting the requirements of second-order harmonic index of the communication protocol for the radio frequency power amplifier.

According to the theory of electromagnetic field, the connection between both the power amplification transistor M1 and the harmonic control circuit and the package substrate is flexibly set without introducing additional components, which significantly reduces the backflow area of harmonic current and greatly improves the electromagnetic compatibility (EMC) of the radio frequency power amplifier.

In the above embodiments, the descriptions of each of the embodiments have their own emphasis, and for the parts not detailed in one embodiment, please refer to the relevant descriptions of other embodiments.

In several embodiments provided by the disclosure, it should be understood that the disclosed device may be implemented in other ways. For example, the above embodiments of device are only illustrative, for example, the division of the above units is only a division based on logical functions, and in actual implementation, there may be another division method, e.g., multiple units or components may be combined or integrated into another system, or some features may be ignored or not executed. In addition, the coupling, direct coupling, or communication connection between the components illustrated or discussed may be indirect coupling or communication connections through some interfaces, devices, or units, which may be electrical or otherwise.

The above units illustrated as separate components may be or may not be physically separated, and the components illustrated as units may be or may not be physical units, i.e., they may be located in one place or distributed to multiple network units. Some or all of the units may be selected according to actual needs to achieve the purpose of the solutions of the embodiments.

The above descriptions are merely specific embodiments of the disclosure, but the protection scope of the disclosure is not limited thereto, and those skilled in the art may readily conceive of variations or substitutions within the scope of the technology disclosed by the disclosure, and the variations or substitutions shall be covered by the protection scope of the disclosure.

A radio frequency power amplifier with harmonic suppression provided by the embodiment of the disclosure includes a power amplifier, a harmonic control circuit, an input matching circuit, an output matching circuit and a package substrate, herein the output matching circuit includes a first matching branch and a second matching branch; one end of the input matching circuit is connected with a radio frequency input end; and the other end of the input matching circuit is connected with a base of the power amplification transistor; a collector of the power amplification transistor is connected with a power supply voltage through the first matching branch, and an emitter of the power amplification transistor is connected with a first connection point on the package substrate; and the collector of the power amplification transistor is connected with a radio frequency output end through the second matching branch; and the second matching branch is connected with the package substrate; a first end of the harmonic control circuit is connected with the collector of the power amplification transistor, and a second end of the harmonic control circuit is connected with a second connection point on the package substrate; and the package substrate includes multiple metal layers arranged in parallel, the metal layer, farthest from the power amplification transistor, of the multiple metal layers arranged in parallel is a first metal layer which is grounded, and a dielectric layer is arranged between adjacent two of the metal layers, and the first connection point is connected with the first metal layer, the first connection point and the second connection point are located on a second metal layer of the multiple metal layers, and the first connection point is connected with the second connection point, and the second metal layer is the metal layer, closest to the power amplification transistor, of the multiple metal layers; and the distance between the first connection point and the second connection point is less than a target distance; in this way, the wiring between both the power amplification transistor and the harmonic control circuit and the package substrate is flexibly set without introducing additional components, which reduces the backflow area of harmonic current, eliminates the parasitic influence of the grounding inductor of the package substrate, improves the efficiency and linearity of the radio frequency power amplifier, and reduces the electromagnetic radiation of the radio frequency power amplifier.

In the harmonic current loop generated by the power amplification transistor, the harmonic current flows back to the power amplification transistor through the low-resistance path composed of the capacitor and inductor of the harmonic control circuit and then through the emitter of the power amplification transistor; in this way, without using the grounding inductor of the package substrate, it solves the problem that the secondary voltage component on the grounding inductor is superimposed on the output voltage and improves the efficiency of the power amplifier.

The harmonic short-circuit circuit composed of the capacitor and inductor of the harmonic control circuit does not need to connect to the equivalent grounding inductor of the package substrate; so that the equivalent inductor obtained after the inductor of the resonant control circuit and the equivalent grounding inductor of the package substrate are connected in series is equal to the inductor of the resonant control circuit, so as to ensure that the quality factor of the equivalent inductor after being connected in series is equal to that of the inductor of the resonant control circuit, and the equivalent impedance of the harmonic short-circuit resistance is reduced, the degree of harmonic suppression is better, and the harmonic power output by the output end becomes smaller, thus meeting the requirements of harmonic index of the communication protocol for the radio frequency power amplifier.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A radio frequency power amplifier with harmonic suppression, comprising:
   a power amplification transistor;
   a harmonic control circuit;
   an input matching circuit;
   an output matching circuit; and
   a package substrate,
   wherein
   the output matching circuit comprises a first matching branch and a second matching branch;
   one end of the input matching circuit is connected with a radio frequency input end; and
   the other end of the input matching circuit is connected with a base of the power amplification transistor;
   a collector of the power amplification transistor is connected with a power supply voltage through the first matching branch, and an emitter of the power amplification transistor is connected with a first connection point on the package substrate;
   the collector of the power amplification transistor is connected with a radio frequency output end through the second matching branch; and the second matching branch is connected with the package substrate;
   a first end of the harmonic control circuit is connected with the collector of the power amplification transistor, and a second end of the harmonic control circuit is connected with a second connection point on the package substrate; and
   the package substrate comprises a plurality of metal layers arranged in parallel, among which a metal layer most distal from the power amplification transistor is a first metal layer and is grounded;
   a dielectric layer is arranged between adjacent two of the plurality of metal layers;
   the first connection point is connected with the first metal layer;
   the first connection point and the second connection point are located on a second metal layer of the plurality of metal layers;
   the first connection point is connected with the second connection point;
   the second metal layer is a metal layer most proximal to the power amplification transistor among the plurality of metal layers; and
   a distance between the first connection point and the second connection point is less than a target distance.

2. The radio frequency power amplifier with harmonic suppression of claim 1, wherein the harmonic control circuit comprises a first branch, and the first branch comprises a first capacitor and a first inductor; and wherein the first capacitor and the first inductor are connected in series.

3. The radio frequency power amplifier with harmonic suppression of claim 2, wherein the harmonic control circuit further comprises at least a second branch, and the second branch comprises a second capacitor and a second inductor; and wherein the second capacitor and the second inductor are connected in series, and each of the second branches is connected in parallel with the first branch.

4. The radio frequency power amplifier with harmonic suppression of claim 3, wherein the first capacitor is a variable capacitor.

5. The radio frequency power amplifier with harmonic suppression of claim 1, wherein one end of the second matching branch is connected with the collector of the power amplification transistor, and the other end of the second matching branch is connected with a third connection point on the first metal layer; and the output matching circuit is configured to provide load impedance for the power amplification transistor.

6. The radio frequency power amplifier with harmonic suppression of claim 5, wherein the first matching branch comprises an inductor, and the first matching branch is configured to supply power to the power amplification transistor.

7. The radio frequency power amplifier with harmonic suppression of claim 6, wherein the second matching branch comprises a third inductor and a third capacitor, and one end of the third inductor is connected with the collector of the power amplification transistor, the other end of the third inductor is connected with one end of the third capacitor, and the other end of the third capacitor is connected with the third connection point.

8. The radio frequency power amplifier with harmonic suppression of claim 7, wherein the output matching circuit further comprises a third matching branch, and the third matching branch comprises a fourth inductor and a fourth capacitor, and one end of the fourth inductor is connected between the third inductor and the third capacitor, the other end of the fourth inductor is connected with one end of the fourth capacitor, and the other end of the fourth capacitor is connected with a fourth connection point on the first metal layer.

9. The radio frequency power amplifier with harmonic suppression of claim 1, wherein the input matching circuit is arranged between the base of the power amplification transistor and the radio frequency input end, and the input matching circuit is configured to match the impedance between components.

10. A communication system comprising the radio frequency power amplifier with harmonic suppression of claim 1, wherein wiring between both the power amplification transistor and the harmonic control circuit and the package substrate is flexibly set without introducing additional components, thereby reducing backflow area of harmonic current and parasitic influence of a grounding inductor of the package substrate, improving efficiency and linearity of the radio frequency power amplifier, and reducing electromagnetic radiation of the radio frequency power amplifier.

11. The communication system of claim 10, wherein in a harmonic current loop generated by the power amplification transistor, the harmonic current is configured to flow back to the power amplification transistor through a low-resistance path comprising a capacitor and an inductor of the harmonic control circuit, and then through the emitter of the power amplification transistor without going through the grounding inductor of the package substrate, thereby avoiding that a secondary voltage component on the grounding inductor is superimposed on an output voltage, and improving the efficiency of the radio frequency power amplifier.

12. The communication system of claim 11, wherein a harmonic short-circuit circuit comprising the capacitor and inductor of the harmonic control circuit is not coupled to an equivalent grounding inductor of the package substrate, such that that the equivalent grounding inductor of the package substrate obtained after the inductor of the harmonic control circuit and the equivalent grounding inductor of the package substrate are connected in series is equal to the inductor of the harmonic control circuit, so as to ensure that a quality factor of the equivalent inductor after being connected in series is equal to that of the inductor of the harmonic control circuit, and an equivalent impedance of a harmonic short-circuit resistance is reduced, improving harmonic suppression, and reducing harmonic power output.

13. The communication system of claim 12, wherein the harmonic control circuit comprises a first branch, and the first branch comprises a first capacitor and a first inductor; and wherein the first capacitor and the first inductor are connected in series.

14. The communication system of claim 13, wherein the harmonic control circuit further comprises at least a second branch, and the second branch comprises a second capacitor and a second inductor; and wherein the second capacitor and the second inductor are connected in series, and each of the second branches is connected in parallel with the first branch.

15. The communication system of claim 14, wherein the first capacitor is a variable capacitor.

16. The communication system of claim 12, wherein one end of the second matching branch is connected with the collector of the power amplification transistor, and the other end of the second matching branch is connected with a third connection point on the first metal layer; and the output matching circuit is configured to provide load impedance for the power amplification transistor.

17. The communication system of claim 16, wherein the first matching branch comprises an inductor, and the first matching branch is configured to supply power to the power amplification transistor.

18. The communication system of claim 17, wherein the second matching branch comprises a third inductor and a third capacitor, and one end of the third inductor is connected with the collector of the power amplification transistor, the other end of the third inductor is connected with one end of the third capacitor, and the other end of the third capacitor is connected with the third connection point.

19. The communication system of claim 18, wherein the output matching circuit further comprises a third matching branch, and the third matching branch comprises a fourth inductor and a fourth capacitor, and one end of the fourth inductor is connected between the third inductor and the third capacitor, the other end of the fourth inductor is connected with one end of the fourth capacitor, and the other end of the fourth capacitor is connected with a fourth connection point on the first metal layer.

20. The communication system of claim 12, wherein the input matching circuit is arranged between the base of the power amplification transistor and the radio frequency input end, and the input matching circuit is configured to match the impedance between components.

* * * * *